United States Patent
Tanzawa

(10) Patent No.: US 10,734,049 B2
(45) Date of Patent: *Aug. 4, 2020

(54) APPARATUSES AND METHODS INVOLVING ACCESSING DISTRIBUTED SUB-BLOCKS OF MEMORY CELLS

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/237,346

(22) Filed: Dec. 31, 2018

(65) Prior Publication Data

US 2019/0279695 A1   Sep. 12, 2019

Related U.S. Application Data

(63) Continuation of application No. 15/720,960, filed on Sep. 29, 2017, now Pat. No. 10,170,169, which is a
(Continued)

(51) Int. Cl.
| | |
|---|---|
| *G11C 16/00* | (2006.01) |
| *G11C 8/10* | (2006.01) |
| *G11C 7/02* | (2006.01) |
| *G11C 8/12* | (2006.01) |
| *G11C 8/16* | (2006.01) |
| *G11C 8/18* | (2006.01) |
| *G11C 5/02* | (2006.01) |

(Continued)

(52) U.S. Cl.
CPC ............. *G11C 8/10* (2013.01); *G11C 5/025* (2013.01); *G11C 5/063* (2013.01); *G11C 7/00* (2013.01); *G11C 7/02* (2013.01); *G11C 8/12* (2013.01); *G11C 8/16* (2013.01); *G11C 8/18* (2013.01); *G11C 11/4087* (2013.01); *G11C 13/003* (2013.01); *G11C 13/0004* (2013.01)

(58) Field of Classification Search
CPC ..................................................... G11C 8/12
USPC .................................................... 365/185.11
See application file for complete search history.

(56) References Cited

U.S. PATENT DOCUMENTS

| | | |
|---|---|---|
| 5,204,842 A | 4/1993 | Umeki |
| 5,367,655 A | 11/1994 | Grossman et al. |

(Continued)

FOREIGN PATENT DOCUMENTS

| | | |
|---|---|---|
| CN | 1930635 A | 3/2007 |
| CN | 101315612 A | 12/2008 |

(Continued)

OTHER PUBLICATIONS

"Chinese Application Serial No. 201380049356.8, Amendment filed Jul. 8, 2015", w/English Claims, 17 pgs.

(Continued)

*Primary Examiner* — Hoai V Ho
(74) *Attorney, Agent, or Firm* — Schwegman Lundberg & Woessner, P.A.

(57) ABSTRACT

Apparatuses and methods involving accessing distributed sub-blocks of memory cells are described. In one such method, distributed sub-blocks of memory cells in a memory array are enabled to be accessed at the same time. Additional embodiments are described.

18 Claims, 7 Drawing Sheets

Related U.S. Application Data continuation of application No. 14/542,244, filed on Nov. 14, 2014, now Pat. No. 9,779,791, which is a continuation of application No. 13/590,926, filed on Aug. 21, 2012, now Pat. No. 8,891,305.

(51) Int. Cl.

| | | |
|---|---|---|
| *G11C 5/06* | (2006.01) | |
| *G11C 11/408* | (2006.01) | |
| *G11C 7/00* | (2006.01) | |
| *G11C 13/00* | (2006.01) | |

(56) References Cited

U.S. PATENT DOCUMENTS

| | | | |
|---|---|---|---|
| 6,098,145 A | 8/2000 | Huang | |
| 6,249,476 B1 | 6/2001 | Yamazaki et al. | |
| 7,002,825 B2 | 2/2006 | Scheuerlein | |
| 7,505,328 B1 | 3/2009 | Torii | |
| 7,512,733 B2 | 3/2009 | Nakamura et al. | |
| 7,633,829 B2 | 12/2009 | Fasoli et al. | |
| 7,649,788 B2 | 1/2010 | Norman | |
| 7,940,554 B2 | 5/2011 | Scheuerlein et al. | |
| 8,094,510 B2 | 1/2012 | Scheuerlein | |
| 8,891,305 B2 | 11/2014 | Tanzawa | |
| 9,779,791 B2 | 10/2017 | Tanzawa | |
| 10,170,169 B2 * | 1/2019 | Tanzawa .................. | G11C 7/02 |
| 2003/0142544 A1 | 7/2003 | Maayan et al. | |
| 2007/0079056 A1 | 4/2007 | Nakamura et al. | |
| 2009/0292944 A1 | 11/2009 | Gonzalez et al. | |
| 2009/0303767 A1 | 12/2009 | Akerib et al. | |
| 2010/0232199 A1 | 9/2010 | Maejima | |
| 2011/0179239 A1 | 7/2011 | Kajigaya | |
| 2012/0079175 A1 | 3/2012 | Flynn et al. | |
| 2012/0129301 A1 | 5/2012 | Or-bach et al. | |
| 2012/0203952 A1 | 8/2012 | Periyannan | |
| 2012/0206980 A1 | 8/2012 | Norman | |
| 2014/0056070 A1 | 2/2014 | Tanzawa | |
| 2015/0063022 A1 | 3/2015 | Tanzawa | |
| 2018/0122443 A1 | 5/2018 | Tanzawa | |

FOREIGN PATENT DOCUMENTS

| | | |
|---|---|---|
| CN | 104685569 A | 6/2015 |
| CN | 104685569 B | 7/2016 |
| JP | 2000195252 A | 7/2000 |
| JP | 2007095222 A | 4/2007 |
| JP | 2007520842 A | 7/2007 |
| JP | 6321650 B2 | 4/2018 |
| TW | 201419302 A | 5/2014 |
| WO | WO-2014031624 A1 | 2/2014 |

OTHER PUBLICATIONS

"Chinese Application Serial No. 201380049356.8, Office Action dated Sep. 6, 2015", w/English Translation, 9 pgs.

"Chinese Application Serial No. 201380049356.8, Response filed Dec. 17, 2015 to Office Action dated Sep. 6, 2015", w/English Claims, 15 pgs.

"European Application Serial No. 13830579.2, Communication Pursuant to Article 94(3) EPC dated Apr. 8, 2019", 5 pgs.

"European Application Serial No. 13830579.2, Extended European Search Report dated Mar. 15, 2016", 8 pgs.

"European Application Serial No. 13830579.2, Noting of loss of rights mailed Nov. 23, 2016", 1 pg.

"International Application Serial No. PCT/US2013/055767, International Preliminary Report on Patentability dated Mar. 5, 2015", 10 pgs.

"International Application Serial No. PCT/US2013/055767, International Search Report dated Dec. 27, 2013", 3 pgs.

"International Application Serial No. PCT/US2013/055767, Written Opinion dated Dec. 27, 2013", 8 pgs.

"Japanese Application Serial No. 2015-528581, Office Action dated Apr. 26, 2016", (English Translation), 8 pgs.

"Japanese Application Serial No. 2015-528581, Office Action dated Sep. 19, 2017", w/English Translation, 6 pgs.

"Japanese Application Serial No. 2015-528581, Response filed Dec. 18, 2017 to Office Action dated Sep. 19, 2017", w/ Amended Claims, 16 pgs.

"Taiwanese Application Serial No. 102129342 Response filed May 8, 2015 to Office Action dated Feb. 6, 2015", With the English claims, 11 pgs.

"Taiwanese Application Serial No. 102129342, Office Action dated Feb. 6, 2015",w/English Translation, 20 pgs.

"European Application Serial No. 13830579.2, Response filed Aug. 15, 2019 to Communication Pursuant to Article 94(3) EPC dated Apr. 8, 2019", w/ English Claims, 13 pgs.

"Korean Application Serial No. 10-2015-7007295, Notice of Preliminary Rejection dated Nov. 19, 2019", W/ English Translation, 14 pgs.

* cited by examiner

APPARATUSES AND METHODS INVOLVING ACCESSING DISTRIBUTED SUB-BLOCKS OF MEMORY CELLS

PRIORITY APPLICATION

This application is a continuation of Ser. No. 15/720,960, filed Sep. 29, 2017, which is a U.S. application Ser. No. is a continuation of U.S. application Ser. No. 14/542,244, filed Nov. 14, 2014, which is a continuation of U.S. application Ser. No. 13/590,926, filed Aug. 21, 2012, all of which are incorporated herein by reference in their entirety.

BACKGROUND

Semiconductor memory devices formed in integrated circuits (ICs) are used in many electronic devices such as personal digital assistants (PDAs), laptop computers, mobile phones and digital cameras.

BRIEF DESCRIPTION OF THE DRAWINGS

Some embodiments are illustrated by way of example and not limitation in the figures of the accompanying drawings in which.

DETAILED DESCRIPTION

For the purposes of this document, a memory cell (cell) includes a phase change memory cell, a dynamic random access memory (DRAM) memory cell, or a charge storage memory cell, such as a transistor having a charge trap or a floating gate, for example, although embodiments are not specifically limited to just those cells. Each cell may comprise a multi-state device capable of storing one of multiple separate and distinct states, each state representing different data. An "apparatus" can refer to any of a number of structures, such as circuitry, a device or a system.

Electrical current can flow in a cell during an operation such as a programming operation, a read operation or an erase operation on the cell. A substantial amount of current can flow through one region of a memory array if multiple cells are being accessed at the same time and the cells are near each other in the same region. The cells outside the region may not be drawing current when the cells in the region are being accessed, and an imbalance in current flow can result in noise in the memory array.

The inventor has discovered that the challenges noted above, as well as others, can be addressed by accessing multiple sub-blocks of cells that are distributed across a memory array at the same time. The current that flows through the cells in the sub-blocks during an operation is then distributed across the memory array.

Figure 1:
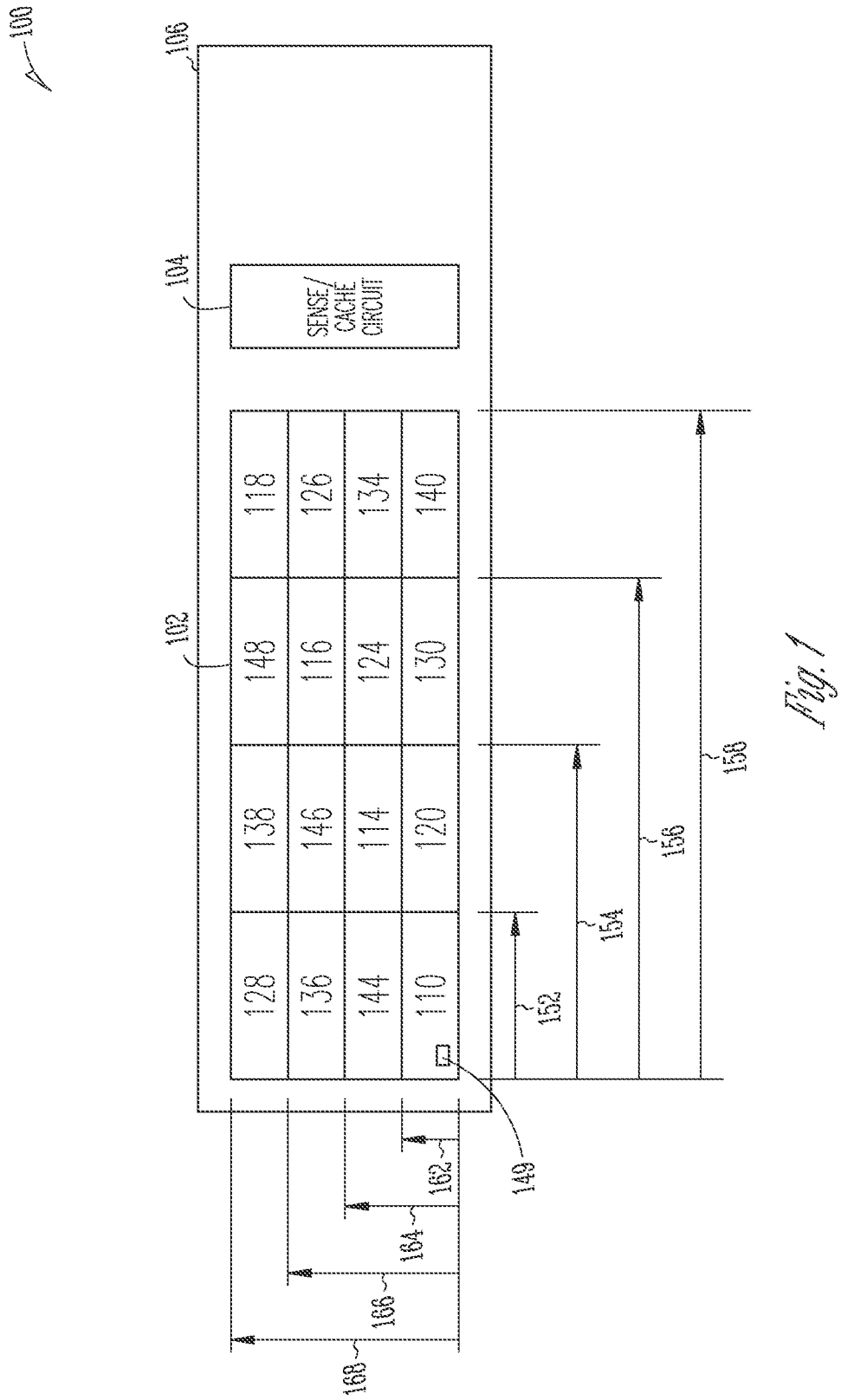
FIG. 1 is a block diagram of an apparatus in the form of a memory device according to various embodiments of the invention.

FIG. 1 is a block diagram of an apparatus in the form of a memory device 100 according to various embodiments of the invention. A substantially rectangular two-dimensional array 102 of cells and a sense/cache circuit 104 are formed on a semiconductor substrate 106. The cells in the array 102 are divided into sub-blocks 110, 114, 116, 118, 120, 124, 126, 128, 130, 134, 136, 138, 140, 144, 146 and 148. Each of the sub-blocks 110-148 includes two or more cells that can be accessed by one or more access lines (e.g., word lines, not shown) and provide data on one or more data lines (not shown) that are coupled to the sense/cache circuit 104. For example, the sub-block 110 includes a cell 149. Each of the sub-blocks 110-148 may contain thousands of cells. A three-dimensional array of cells may comprise multiple two-dimensional arrays of cells such as the array 102 stacked one over the other.

The illustrated array 102 is divided into four rows of sub-blocks, each row of sub-blocks in the array 102 comprising a sub-array including four of the sub-blocks 110-148. The illustrated array 102 is also divided into four columns of the sub-blocks 110-148. Boundaries of the sub-blocks 110-148 are shown by horizontal and vertical lines in FIG. 1.

Each of the sub-blocks 110-148 in the array 102 has a location that can be defined with reference to a first coordinate and a second coordinate in a coordinate system. For example, each sub-block can be located in a two-dimensional array with reference to an x-coordinate and a y-coordinate from a reference location (e.g., origin) in the Cartesian coordinate system. Sub-blocks may be located in the array 102 according to other coordinate systems such as the Polar coordinate system. For example, a sub-block can be located in the array 102 by a radial coordinate from a corner of the array 102 and an angular coordinate from a boundary of the array 102.

Each of the sub-blocks 110-148 can have dimensions of, for example, approximately 800 micrometers by approximately 200 nanometers, at least according to one embodiment of the invention. Sub-blocks can be located in the array 102 according to the Cartesian coordinate system with an origin at the lower left corner of the sub-block 110. A horizontal boundary for the sub-blocks 110, 128, 136 and 144 is at an x-coordinate 152 that is, for example, approximately 800 micrometers from the origin. The sub-blocks 114, 120, 138 and 146 are between the x-coordinate 152 and an x-coordinate 154 that is, for example, approximately 1600 micrometers from the origin. The sub-blocks 116, 124, 130 and 148 are between the x-coordinate 154 and an x-coordinate 156 that is, for example, approximately 2400 micrometers from the origin. The sub-blocks 118, 126, 134 and 140 are between the x-coordinate 156 and an x-coordinate 158 that is, for example, approximately 3200 micrometers from the origin. A vertical boundary for the sub-blocks 110, 120, 130 and 140 is at a y-coordinate 162 that is, for example, approximately 200 nanometers from the origin. The sub-blocks 114, 124, 134 and 144 are between the y-coordinate 162 and a y-coordinate 164 that is, for example, approximately 400 nanometers from the origin. The sub-blocks 116, 126, 136 and 146 are between the y-coordinate 164 and a y-coordinate 166 that is, for example, approximately 600 nanometers from the origin. The sub-blocks 118, 128, 138 and 148 are between the y-coordinate 166 and a y-coordinate 168 that is, for example, approximately 800 nanometers from the origin.

All cells in a block of cells (where a block comprises a group of sub-blocks) in the array 102 are enabled to be accessed at the same time. Cells outside the block are not enabled to be accessed when a cell(s) in the block is accessed such as, for example, during a programming operation, a read operation or an erase operation. In the illustrated embodiment, each block of cells includes four of the sub-blocks 110-148 that can be enabled by a decoder circuit and are distributed across the array 102.

Figure 2:
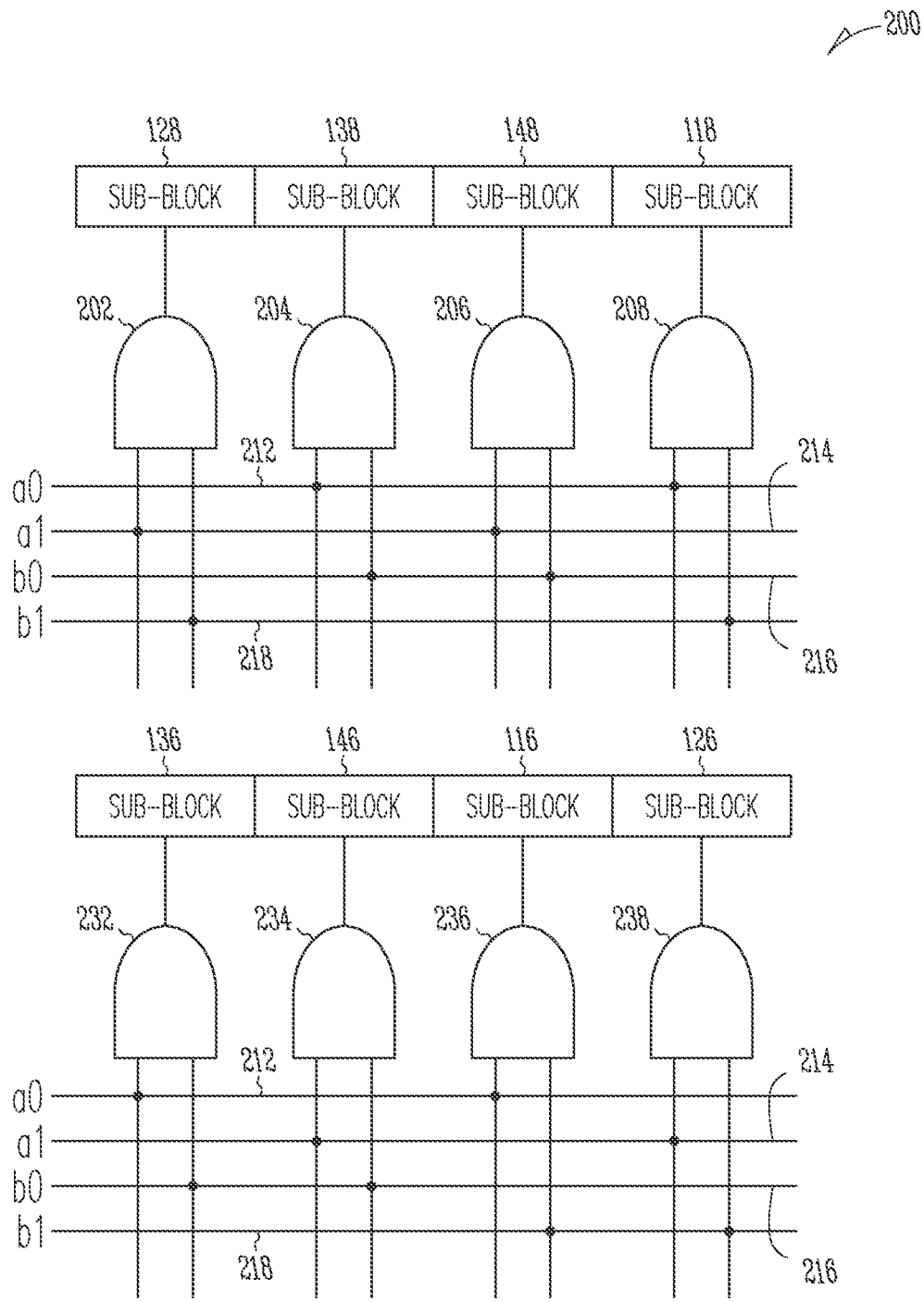
FIG. 2 is a schematic circuit view of an apparatus in the form of a decoder circuit according to various embodiments of the invention.

FIG. 2 is a schematic circuit view of an apparatus in the form of a decoder circuit 200 according to various embodiments of the invention. The cells in each of the sub-blocks 110-148 can be enabled to be accessed by a block enable signal provided (e.g., generated) by an enable circuit, such as a logic gate selectively activated in response to decoding signals, in a decoder circuit such as the decoder circuit 200. The decoder circuit 200 can enable the cells of two of the sub-blocks 110-148 in the array 102 to be accessed, and the cells of two others of the sub-blocks 110-148 can be enabled to be accessed at the same time by a substantially similar decoder circuit (not shown). For example, the block enable signal can enable access lines coupled to the cells in the sub-blocks to receive programming voltages or read voltages or erase voltages.

The sub-blocks 118, 128, 138 and 148 comprise a first sub-array in the array 102, and the cells in each of the sub-blocks 118, 128, 138 and 148 can be enabled by a block enable signal from one of four respective circuits such as logic gates such as AND gates 202, 204, 206 and 208. Each of the AND gates 202-208 includes a first input coupled to one of two lines 212 and 214 carrying complementary decoding signals a0 and a1, respectively. One of the decoding signals a0 and a1 is high, and one of the decoding signals a0 and a1 is low. Each of the AND gates 202-208 includes a second input coupled to one of two lines 216 and 218 carrying complementary decoding signals b0 and b1, respectively. One of the decoding signals b0 and b1 is high, and one of the decoding signals b0 and b1 is low. The inputs of the AND gates 202-208 are coupled to the lines 212-218 in a pattern such that only one of the AND gates 202-208 provides a high block enable signal to enable only one of the sub-blocks 118, 128, 138 and 148 in the first sub-array at a time. The decoding signals a0, a1, b0 and b1 are provided to select one of the sub-blocks 118, 128, 138 and 148 based on an address in a memory request.

The sub-blocks 116, 126, 136 and 146 comprise a second sub-array in the array 102, and the cells in each of the sub-blocks 116, 126, 136 and 146 can be enabled by a block enable signal from one of four respective AND gates 232, 234, 236 and 238. Each of the AND gates 232-238 includes a first input coupled to one of the two lines 212 and 214 carrying the decoding signals a0 and a1, respectively. Each of the AND gates 232-238 includes a second input coupled to one of the two lines 216 and 218 carrying the decoding signals b0 and b1, respectively. The inputs of the AND gates 232-238 are coupled to the lines 212-218 in a pattern such that only one of the AND gates 232-238 provides a high block enable signal to enable only one of the sub-blocks 116, 126, 136 and 146 in the second sub-array at one time. The decoding signals a0, a1, b0 and b1 can be changed to disable one or more of the sub-blocks 118, 128, 138, 148, 116, 126, 136 and 146 that were enabled and to enable one or more of the sub-blocks 118, 128, 138, 148, 116, 126, 136 and 146 that were not enabled.

With reference to FIG. 1, operation of the decoder circuit 200 can enable the cells in the sub-blocks 110, 114, 116 and 118 to be accessed at the same time while the cells of the sub-blocks 120, 124, 126, 128, 130, 134, 136, 138, 140, 144, 146 and 148 are not enabled to be accessed during a memory operation. Each enabled sub-block 110 has an x-coordinate and a y-coordinate that are not the same as the x-coordinate and the y-coordinate of any of the other enabled sub-blocks 114, 116 and 118. For example, the sub-block 110 including the cell 149 can have an x-coordinate between 0 and 800 micrometers while the sub-blocks 114, 116 and 118 each have an x-coordinate greater than 800 micrometers. The sub-block 110 including the cell 149 can have a y-coordinate between 0 and 200 nanometers while the sub-blocks 114, 116 and 118 each have a y-coordinate greater than 200 nanometers.

Each enabled sub-block 110, 114, 116 and 118 is in a row of sub-blocks in the memory device 100 that does not include another enabled sub-block and is in a column of sub-blocks that does not include another enabled sub-block. Each row of sub-blocks includes only one enabled sub-block at a time and each column of sub-blocks includes only one enabled sub-block at a time. The enabled sub-blocks 110, 114, 116 and 118 are separated from each other by the sub-blocks 120, 124, 126, 128, 130, 134, 136, 138, 140, 144, 146 and 148 that are not enabled to be accessed. Each of the enabled sub-blocks 110, 114, 116 and 118 is adjacent only to sub-blocks that are not enabled to be accessed.

Figure 3:
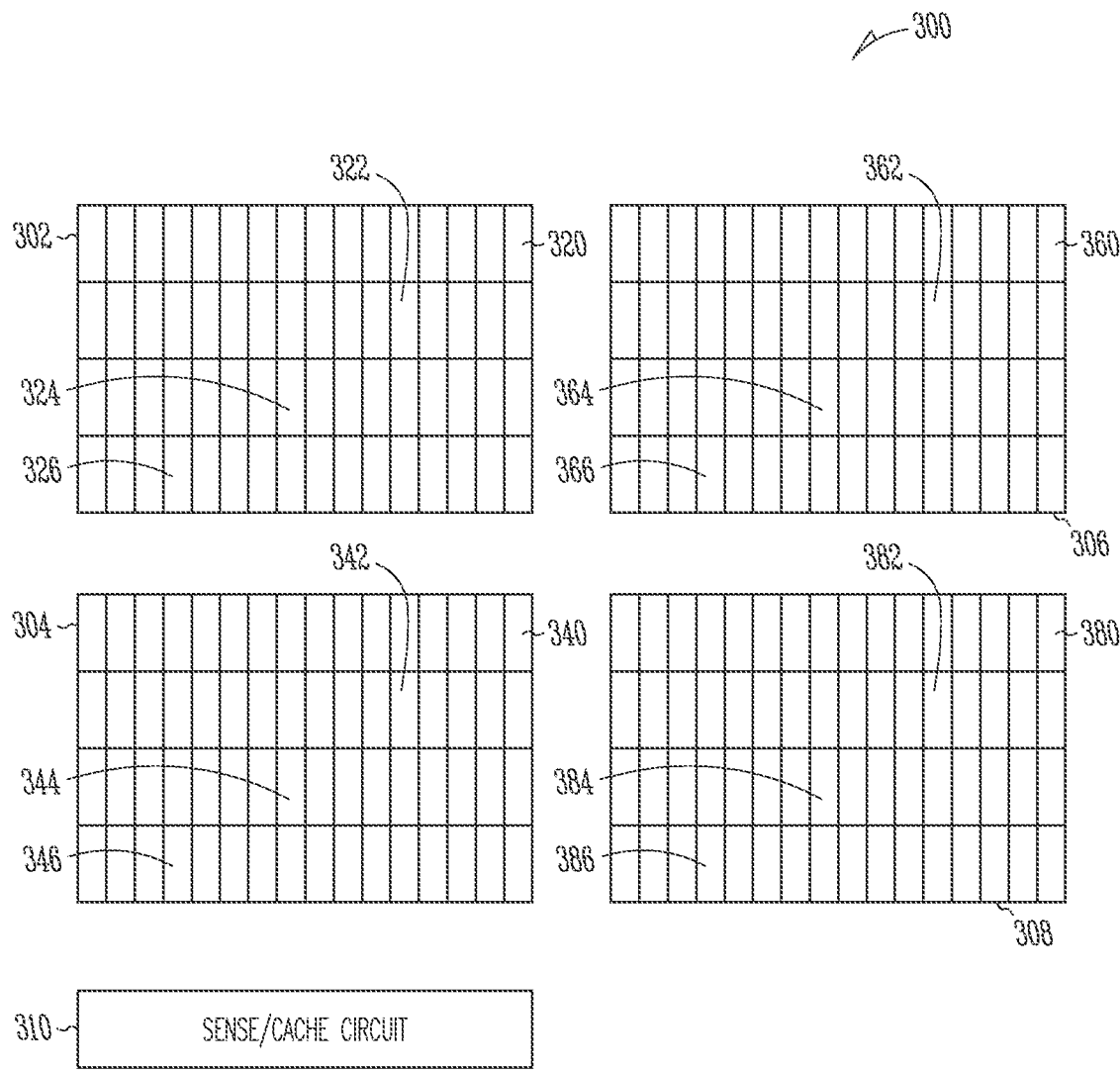
FIG. 3 is a block diagram of an apparatus in the form of a memory device according to various embodiments of the invention.

FIG. 3 is a block diagram of an apparatus in the form of a memory device 300 according to various embodiments of the invention. The memory device 300 is three-dimensional and comprises four substantially rectangular two-dimensional arrays 302, 304, 306 and 308 of cells that are stacked together. The arrays 302, 304, 306 and 308 are shown separated for purposes of clarity. The memory device 300 also comprises a sense/cache circuit 310. The arrays 302, 304, 306 and 308 and the sense/cache circuit 310 are formed on a semiconductor substrate (not shown). In some embodiments, the array 302 may be formed on a substrate, after which the array 304 is formed over the array 302, after which the array 306 is formed over the array 304, after which the array 308 is formed over the array 306. In this way, a stack of the arrays 302, 304, 306, 308 is formed over the substrate.

The cells in the arrays 302, 304, 306 and 308 are arranged in sub-blocks of cells. Boundaries of the sub-blocks are shown by horizontal and vertical lines in FIG. 3. Each array 302, 304, 306 and 308 includes four rows of sub-blocks and 16 columns of sub-blocks for a total of 64 sub-blocks of cells in each array 302, 304, 306 and 308. Each of the sub-blocks is located in one row of sub-blocks and in one column of sub-blocks in one of the arrays 302, 304, 306 and 308. Each row of sub-blocks in the arrays 302, 304, 306 and 308 comprises a sub-array including 16 of the sub-blocks. The sub-blocks have substantially the same dimensions in all of the arrays 302, 304, 306 and 308 such that each sub-block in each array 302, 304, 306 and 308 is directly under and/or over corresponding sub-blocks in the other arrays 302, 304, 306 and 308.

All cells in a block in the arrays 302, 304, 306 and 308 are enabled to be accessed at the same time. Cells outside the block are not enabled to be accessed when cells in the block are enabled to be accessed such as, for example, during a programming operation, a read operation or an erase operation. Each block in the memory device 300 includes four sub-blocks in each of the arrays 302, 304, 306 and 308 that can be enabled by a decoder circuit (not shown) and are distributed across the arrays 302, 304, 306 and 308. A block may include sub-blocks having the same location in the respective arrays 302, 304, 306 and 308. A block can include sub-blocks 320, 322, 324 and 326 in the array 302, sub-blocks 340, 342, 344 and 346 in the array 304, sub-blocks 360, 362, 364 and 366 in the array 306 and sub-blocks 380, 382, 384 and 386 in the array 308. The sub-blocks 320, 340, 360 and 380 occupy the same location in the respective arrays 302, 304, 306 and 308. The sub-blocks 322, 342, 362 and 382 occupy the same location in the respective arrays 302, 304, 306 and 308. The sub-blocks 324, 344, 364 and 384 occupy the same location in the respective arrays 302, 304, 306 and 308. The sub-blocks 326, 346, 366 and 386 occupy the same location in the respective arrays 302, 304, 306 and 308.

Figure 4:
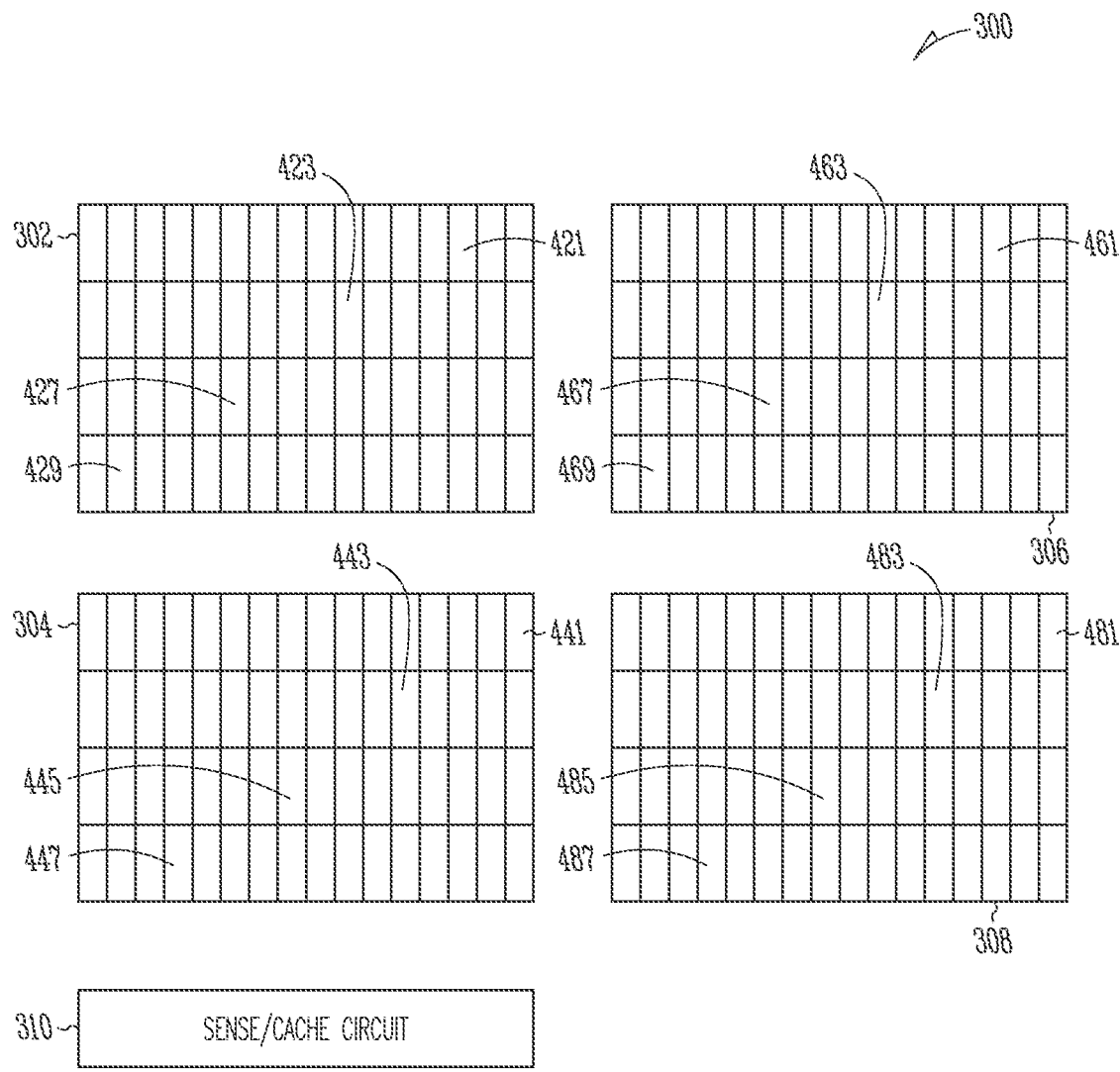
FIG. 4 is a block diagram of the memory device of FIG. 3 according to various embodiments of the invention.

FIG. 4 is a block diagram of the memory device 300 of FIG. 3 according to various embodiments of the invention. A block of cells can include sub-blocks 421, 423, 427 and 429 in the array 302, sub-blocks 441, 443, 445 and 447 in the array 304, sub-blocks 461, 463, 467 and 469 in the array 306 and sub-blocks 481, 483, 485 and 487 in the array 308.

The sub-blocks 421, 423, 427 and 429 in the array 302 do not occupy the same locations as the sub-blocks 441, 443, 445 and 447 in the array 304. The sub-blocks 441, 443, 445 and 447 in the array 304 do not occupy the same locations as the sub-blocks 461, 463, 467 and 469 in the array 306. The sub-blocks 461, 463, 467 and 469 in the array 306 do not occupy the same locations as the sub-blocks 481, 483, 485 and 487 in the array 308. Thus, the sub-blocks that form a block can be selected so that the sub-blocks do, or do not occupy the same locations within corresponding arrays in a stack. Many arrangements are possible.

Figure 5:
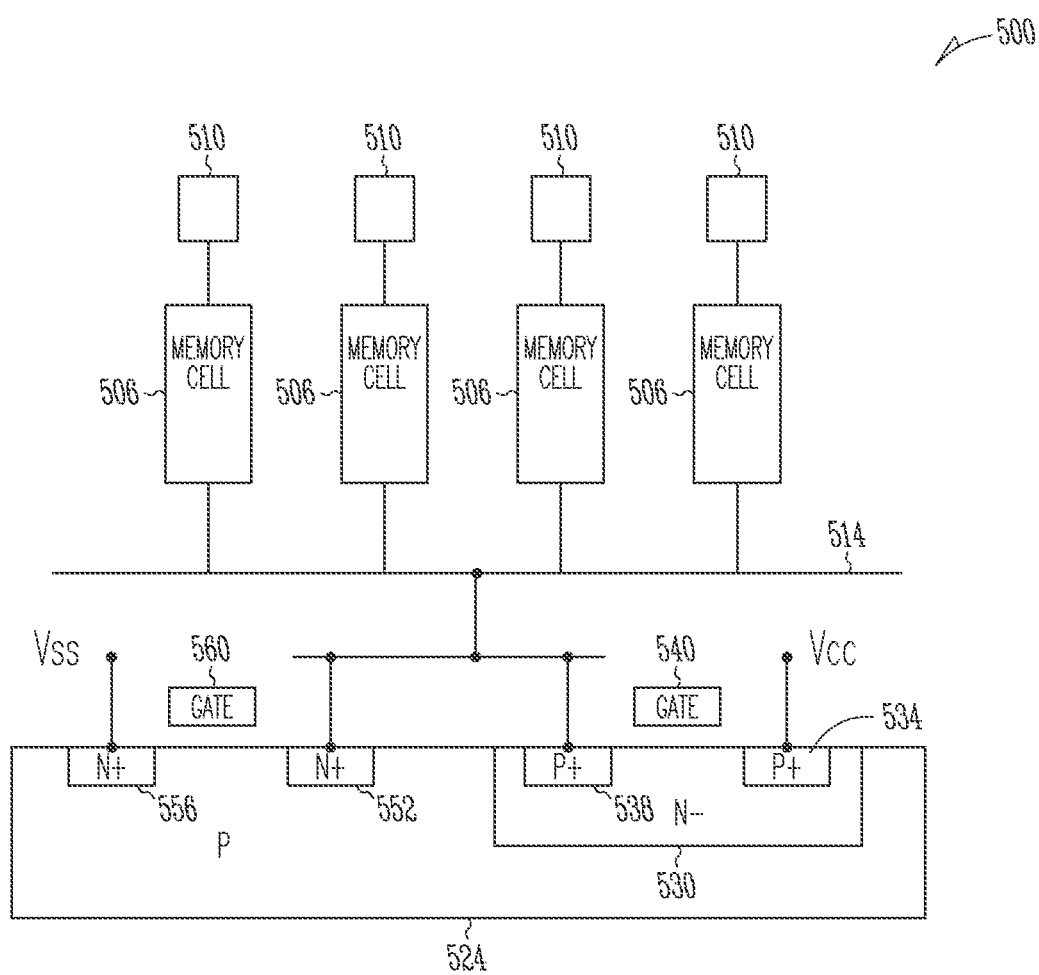
FIG. 5 is a cross-sectional view of a semiconductor construction according to various embodiments of the invention.

FIG. 5 is a cross-sectional view of a semiconductor construction 500 according to various embodiments of the invention. The semiconductor construction 500 may comprise a portion of the memory device 100 shown in FIG. 1. The semiconductor construction 500 includes four strings 506 of charge storage devices, with each string 506 connected to a separate data line 510. The strings 506 are coupled to a single common source 514. The strings 506 are formed over a p-type silicon substrate 524, and the potential of the common source 514 is controlled by the operation of transistors (e.g., complementary metal-oxide semiconductor (CMOS) transistors) in the substrate 524.

An n-type silicon well 530 is formed in the substrate 524. A first p+ type diffusion region 534 and a second p+ type diffusion region 538 are formed in the n-type silicon well 530. The first p+ type diffusion region 534 is coupled to a power supply voltage Vcc node and the second p+ type diffusion region 538 is coupled to the common source 514. A first polysilicon gate 540 is formed over the substrate 524 between the first p+ type diffusion region 534 and a second p+ type diffusion region 538 to form a p-channel transistor between the power supply voltage Vcc node and the common source 514.

A first n+ type diffusion region 552 and a second n+ type diffusion region 556 are formed in the substrate 524. The first n+ type diffusion region 552 is coupled to the common source 514 and the second n+ type diffusion region 556 is coupled to a reference voltage Vss node (e.g., ground voltage). A second polysilicon gate 560 is formed over the substrate 524 between the first n+ type diffusion region 552 and the second n+ type diffusion region 556 to form an n-channel transistor between the reference voltage Vss node and the data line 514.

The first polysilicon gate 540 and the second polysilicon gate 560 are separated from the substrate 524 by a dielectric such as silicon dioxide (not shown). Cross-sectional views of the data lines 510 are shown that are substantially orthogonal to the common source 514. The data lines 510 in FIG. 5 are substantially square, but may have a different geometry. The CMOS transistors in the substrate 524 can draw current from the common source 514 to the reference voltage Vss node and are distributed across an array of cells. Operation of the array of cells according to various embodiments of the invention can reduce noise in the power supply voltage Vcc node and the reference voltage Vss node by operating as described herein, to more evenly distribute current flow across the memory device 100.

Figure 6:
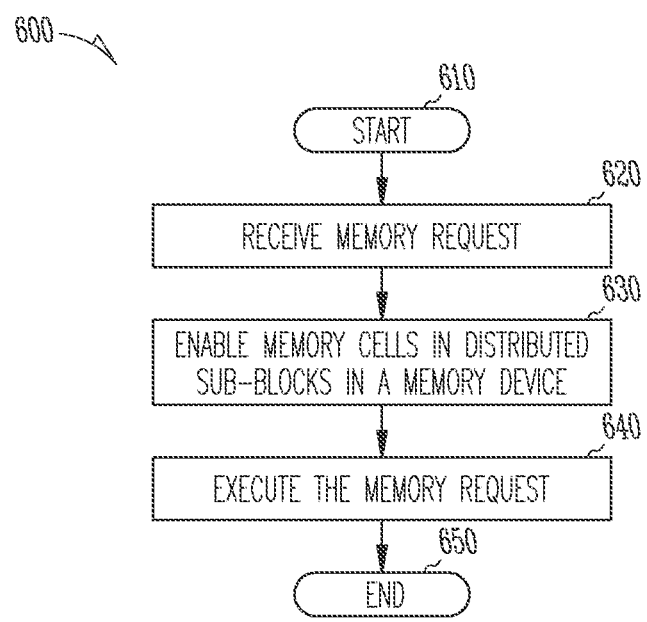
FIG. 6 is a flow diagram of one method according to various embodiments of the invention.

FIG. 6 is a flow diagram of one method 600 according to various embodiments of the invention. In block 610, the method 600 starts. In block 620, a memory request, perhaps including a command and an address, is received in an apparatus, such as a memory device. In block 630, distributed sub-blocks of memory cells in the apparatus are enabled in response to the memory request while other blocks of cells in the memory device are not enabled. With reference to FIG. 1 for example, the sub-blocks 110, 114, 116 and 118 might be enabled to be accessed at the same time while the sub-blocks 120, 124, 126, 128, 130, 134, 136, 138, 140, 144, 146 and 148 are not enabled to be accessed. In block 640, the memory request is executed by a controller to program, read or erase cells in the enabled sub-blocks 110, 114, 116 and 118. In block 650, the method 600 ends. The method 600 more evenly distributes current flow across the memory device to reduce noise in a power supply voltage node and a reference voltage node. Various embodiments may have more or fewer activities than those shown in FIG. 6. In some embodiments, the activities in FIG. 6 may be repeated, substituted for one another, and/or performed in serial or parallel fashion.

Figure 7:
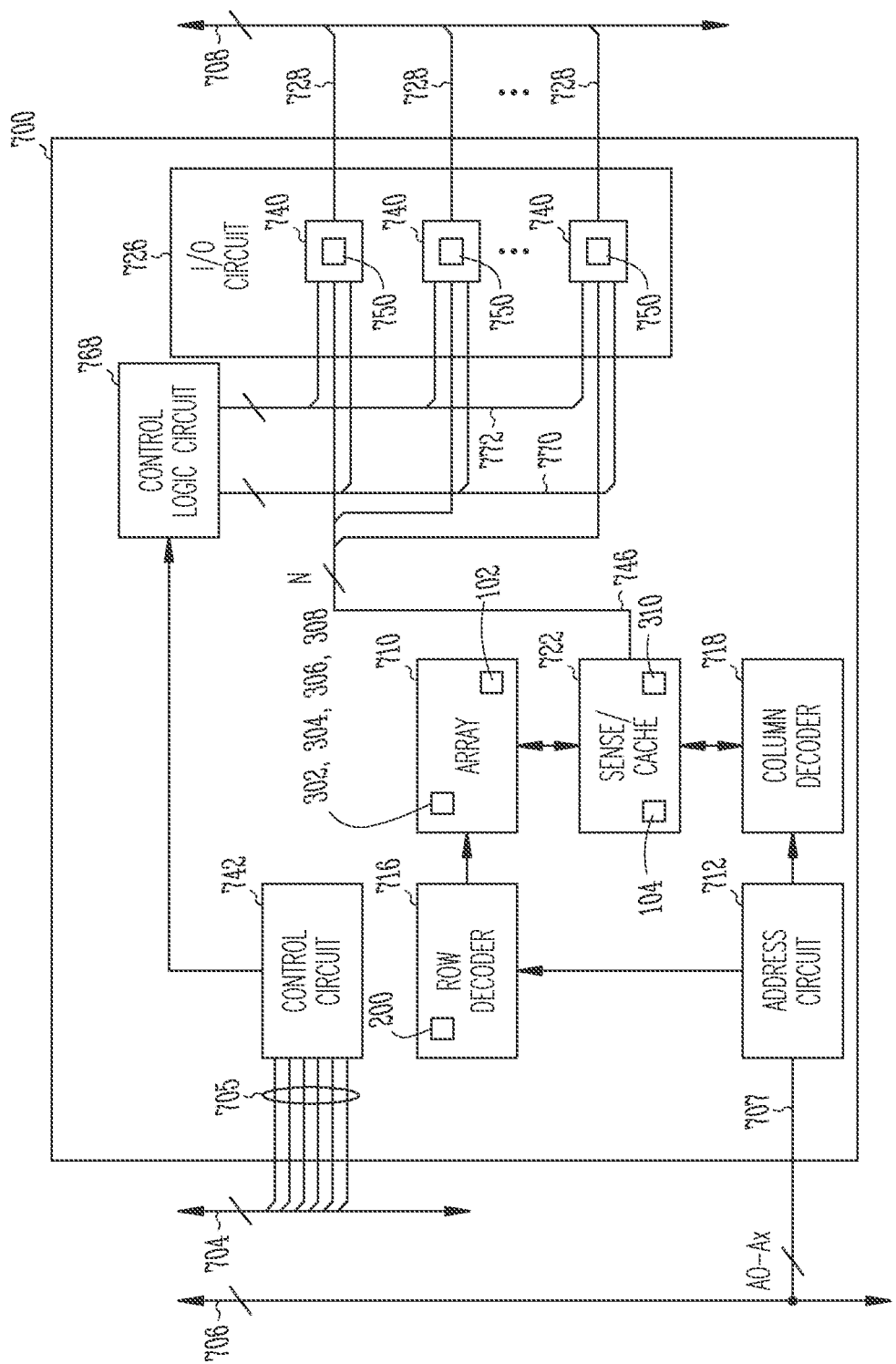
FIG. 7 is a block diagram of an apparatus in the form of a memory device according to various embodiments of the invention.

FIG. 7 is a block diagram of an apparatus in the form of a memory device 700 according to various embodiments of the invention. The memory device 700 is coupled to a control bus 704 to receive multiple control signals over control signal lines 705. The memory device 700 is also coupled to an address bus 706 to receive address signals AO-Ax on address signal lines 707 and to a data bus 708 to transmit and receive data signals. Although depicted as being received on separate physical busses, the data signals could also be multiplexed and received on the same physical bus.

The memory device 700 includes one or more arrays 710 of cells that can be arranged in rows and in columns. The cells of the array 710 can comprise DRAM cells or phase change cells or charge storage cells (e.g., Flash memory cells with floating gate transistors or charge trap transistors) according to various embodiments of the invention. The memory device 700 can comprise a NAND memory device. The array 710 can include multiple banks and blocks of cells residing on a single die or on multiple dice as part of the memory device 700. The cells in the array 710 can be single level cell (SLC) or multilevel cell (MLC) cells, or combinations thereof. The array 710 can include the array 102 of cells shown in FIG. 1 and the arrays 302, 304, 306 and 308 of cells shown in FIGS. 3 and 4 according to various embodiments of the invention.

An address circuit 712 can latch the address signals AO-Ax received on the address signal lines 707. The address signals AO-Ax can be decoded by a row decoder 716 and a column decoder 718 to access data stored in the array 710. The memory device 700 can read data in the array 710 by sensing voltage or current changes in cells in the array 710 using sense devices in a sense/cache circuit 722. The row decoder 716 can include the decoder circuit 200 shown in FIG. 2 according to various embodiments of the invention. The sense/cache circuit 722 can include the sense/cache circuit 104 shown in FIG. 1 and the sense/cache circuit 310 shown in FIGS. 3 and 4 according to various embodiments of the invention.

A data input and output (I/O) circuit 726 implements bi-directional data communication over external (e.g., data I/O) nodes 728 coupled to the data bus 708. The I/O circuit 726 includes N driver and receiver circuits 740 according to various embodiments of the invention. The memory device 700 includes a controller that is configured to support operations of the memory device 700, such as writing data to and/or erasing data from the array 710. The controller can comprise, for example, control circuitry 742 (e.g., configured to implement a state machine) on a same or different die than that which includes the array 710 and/or any or all of the other components of the memory device 700. The controller can comprise the control circuitry 742, firmware, software or combinations of any or all of the foregoing. Data can be transferred between the sense/cache circuit 722 and the I/O circuit 726 over N signal lines 746. A memory request can be received in the control signals and the address signals AO-Ax and can be executed by the controller.

Each driver and receiver circuit 740 can include a driver circuit 750. Control signals can be provided to the driver circuits 750 (e.g., through control logic circuit 768 that is coupled to the control circuitry 742). The control logic circuit 768 can provide the control signals over lines 770 and 772 to the driver circuits 750.

Apparatuses and methods described herein can distribute current flow across an array of cells to reduce noise in the array during memory operations. This can lead to a significant performance improvement, and more reliable operation.

Example structures and methods have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method, comprising:
    simultaneously accessing first and second sub-blocks of memory cells within a first block of memory cells within a first array of memory cells including multiple blocks of memory cells, the first block including multiple sub-blocks in multiple rows and multiple columns within the first block; and
    accessing a third sub-block of memory cells in a second array of memory cells including multiple blocks of memory cells, simultaneously with accessing the first and second sub-blocks of the first block,
    wherein the first and second sub-blocks within the first block are enabled to be accessed simultaneously, and wherein the memory cells in a second block of memory cells are not enabled to be accessed when memory cells of the first block are being accessed;
    wherein the first and second sub-blocks are in different rows of the first block and in different columns of the first block.

2. The method of claim 1, further comprising simultaneously accessing a third sub-block of the first block of memory cells with the first and second sub-blocks, wherein the first, second and third sub-blocks are each in separate rows and in separate columns of the first block.

3. The method of claim 1, when the first and second sub-blocks within the first block are enabled to be accessed, other sub-blocks within the first block are disabled for access.

4. The method of claim 1, wherein the array of memory cells is an array of NAND memory cells.

5. The method of claim 1, wherein the array of memory cells is an array of dynamic random access memory cells.

6. The method of claim 1, wherein the array of memory cells is an array of phase change memory cells.

7. The method of claim 1, wherein the second memory array is vertically stacked relative to the first memory array.

8. The method of claim 7, wherein the first memory array includes a first number of blocks of memory cells, and wherein the stacked second memory array also includes the first number of blocks of memory cells.

9. The method of claim 8, wherein the blocks of the first memory array are vertically aligned with respective blocks of the second memory array.

10. The method of claim 1, further comprising simultaneously accessing additional sub-blocks of the first block of memory cells with the first and second sub-blocks, wherein the multiple simultaneously accessed sub-blocks are in separate rows of sub-blocks of the first block of memory cells, and are in separate columns of sub-blocks of the first block of memory cells.

11. A method of operating a NAND memory structure, comprising:
    accessing memory cells arranged in multiple stacked arrays of memory cells, the stacked arrays having multiple respective blocks of memory cells, wherein the multiple blocks of memory cells comprise respective pluralities of strings of NAND memory cells, and wherein the multiple blocks of memory cells respectively include multiple sub-blocks of strings of memory cells, the sub-blocks arranged in multiple rows and multiple columns within a respective block, the accessing comprising,
    receiving a first memory instruction at control circuitry coupled to the multiple stacked arrays of memory cells, and in response to receipt of the memory instruction,
    accessing first data in a first sub-block of a first block in a first array,
    accessing second data in a second sub-block of the first block in the first array at the same time the first data is being accessed.

12. The method of claim 11, wherein the accessing further comprises accessing third data in response to receipt of the memory request, the third data in a third sub-block the third sub-block in a second block of memory cells located in a second array of the multiple stacked arrays.

13. The method of claim 11, wherein the multiple sub-blocks of memory cells of the first array are vertically aligned with the multiple sub-blocks of memory cells of the stacked second array.

14. The method of claim 13, wherein the third sub-block of the second block of memory cells in the stacked second array is not vertically aligned with either of the first and second sub-blocks of the first block of memory cells in the first array.

15. The method of claim 11, wherein the control circuitry accessing the first and second data in response to the memory instruction comprises writing the first data to memory cells of the first sub-block and writing the second data to memory cells of the second sub-block.

16. The method of claim 11, wherein the control circuitry accessing first and second data in response to the memory instruction comprises erasing the first data from memory cells of the first sub-block and erasing the second data from memory cells of the second sub-block.

17. The method of claim 11, wherein the control circuitry accessing first and second data in response to the memory instruction comprises the first data comprises reading the first data from memory cells of the first sub-block and reading the second data from memory cells of the second sub-block.

18. The method of claim 11, wherein each of the sub-blocks within the first and second arrays has a location that can be defined with reference to a first coordinate and a second coordinate in a coordinate system.

* * * * *